United States Patent
Honma et al.

(10) Patent No.: US 7,589,997 B2
(45) Date of Patent: Sep. 15, 2009

(54) NON-VOLATILE SEMICONDUCTOR MEMORY DEVICE THAT PERFORMS DATA ALLOCATION

(75) Inventors: Mitsuaki Honma, Yokohama (JP); Noboru Shibata, Kawasaki (JP); Shinji Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 11/876,289

(22) Filed: Oct. 22, 2007

(65) Prior Publication Data

US 2008/0094899 A1     Apr. 24, 2008

(30) Foreign Application Priority Data

Oct. 23, 2006   (JP)   ............................. 2006-287707

(51) Int. Cl.
    *G11C 16/04*   (2006.01)
(52) U.S. Cl. ............................. 365/185.03; 365/185.09; 365/185.17
(58) Field of Classification Search ............ 365/185.03, 365/185.09, 185.17
    See application file for complete search history.

(56) References Cited

U.S. PATENT DOCUMENTS

| | | | | |
|---|---|---|---|---|
| 6,094,370 A | * | 7/2000 | Takashima | .................. 365/145 |
| 6,134,148 A | * | 10/2000 | Kawahara et al. | ...... 365/185.28 |
| 6,813,199 B2 | | 11/2004 | Hidaka | |
| 2008/0212370 A1 | * | 9/2008 | Tokiwa | .................. 365/185.09 |

FOREIGN PATENT DOCUMENTS

JP        2001-202793        7/2001

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A non-volatile semiconductor memory device, allocates data contained in an ECC frame as a first data group to be stored in a first memory cell group composed of a plurality of first memory cells selected by a first word line and a second data group to be stored in a second memory cell group composed of a plurality of second memory cells selected by a second word line.

10 Claims, 4 Drawing Sheets

NON-VOLATILE SEMICONDUCTOR MEMORY DEVICE THAT PERFORMS DATA ALLOCATION

CROSS-REFERENCE TO RELATED APPLICATION

This application is based upon and claims the benefit of priority from the prior Japanese Patent Application No. 2006-287707, filed on Oct. 23, 2006, the entire contents of which are incorporated herein by reference.

BACKGROUND OF THE INVENTION

1. Field of the Invention

The present invention relates to a non-volatile semiconductor memory device that performs data allocation.

2. Background Art

Recently, non-volatile semiconductor memory devices are becoming smaller and smaller, and process-induced variations among memory cells depending on the locations thereof are increasing.

In addition, with the advent of multilevel memory cells, which can store multiple-bit information, there is a growing demand for a technique of precisely controlling electrons.

Thus, if data writing is conventionally simply performed in the same procedure, some memory cells require a short time for writing, and other memory cells require a long time for writing.

As a result, an excessively written memory cell or an insufficiently written memory cell, which are referred to as defective bit, can occur. Such a bit causes opposite interpretation of "0" and "1" information.

In order to avoid this, error correction is needed. However, since the error rate varies with location, a simple error correction has a problem that the efficiency of error correction is low.

When recording data, a conventional non-volatile semiconductor memory device divides a data region for a page into a first region and a second region, generates and adds a first error correction code and a second error correction code for the first region and the second region, respectively, and generates and adds a third error correction code for the whole region for the page. When reading the data, syndromes for the first and second regions are determined from the data read from the first and second regions and reproduced data of the first and second error correction codes generated for and added to the first and second regions, the number of errors is determined from the reproduced data read from the whole region for the page and reproduced data of the third error correction code, the error condition of the first and second regions is determined from the first and second syndromes and the number of errors, and an error correction processing is performed. If 1-bit error occurs in each region, 2-bit error data can be corrected (see Japanese Patent Laid-Open Publication No. 2001-202793, for example).

Thus, the conventional technique described above can increase the number of errors that can be corrected without increasing the number of ECC codes.

However, the conventional technique described above does not take into account the fact that the error rate varies with location and does not improve the efficiency of error correction by averaging of the location-dependence error rate.

SUMMARY OF THE INVENTION

According to one aspect of the present invention, there is provided: a non-volatile semiconductor memory device, comprising a memory cell array including a plurality of memory cells that are connected to word lines extending in a row direction and bit lines extending in a column direction, store x-bit information corresponding to $2^x$ threshold voltages (x is an integer equal to or greater than 2), the stored x-bit information being capable of being read by applying a read voltage to said word lines;

a row decoder that is connected to said word lines and supplies a voltage to said word lines to make said memory cells operate;

a sense amplifier device that is connected to said bit lines, reads data stored in said memory cells and retains the read data and data written to said memory cells;

a code word generating circuit that creates an ECC frame composed of input information data and redundant data to be stored in said memory cells based on said information data; and an error correcting circuit that corrects said information data based on said information data and said redundant data of said ECC frame, wherein data contained in said ECC frame is allocated as a first data group to be stored in a first memory cell group composed of a plurality of first memory cells selected by a first word line and a second data group to be stored in a second memory cell group composed of a plurality of second memory cells selected by a second word line.

DETAILED DESCRIPTION

In the following, embodiments of the present invention will be described with reference to the drawings. In the embodiments described below, the present invention is applied to a NAND flash memory. However, the present invention can be equally applied to a NOR flash memory.

First Embodiment

Figure 1:
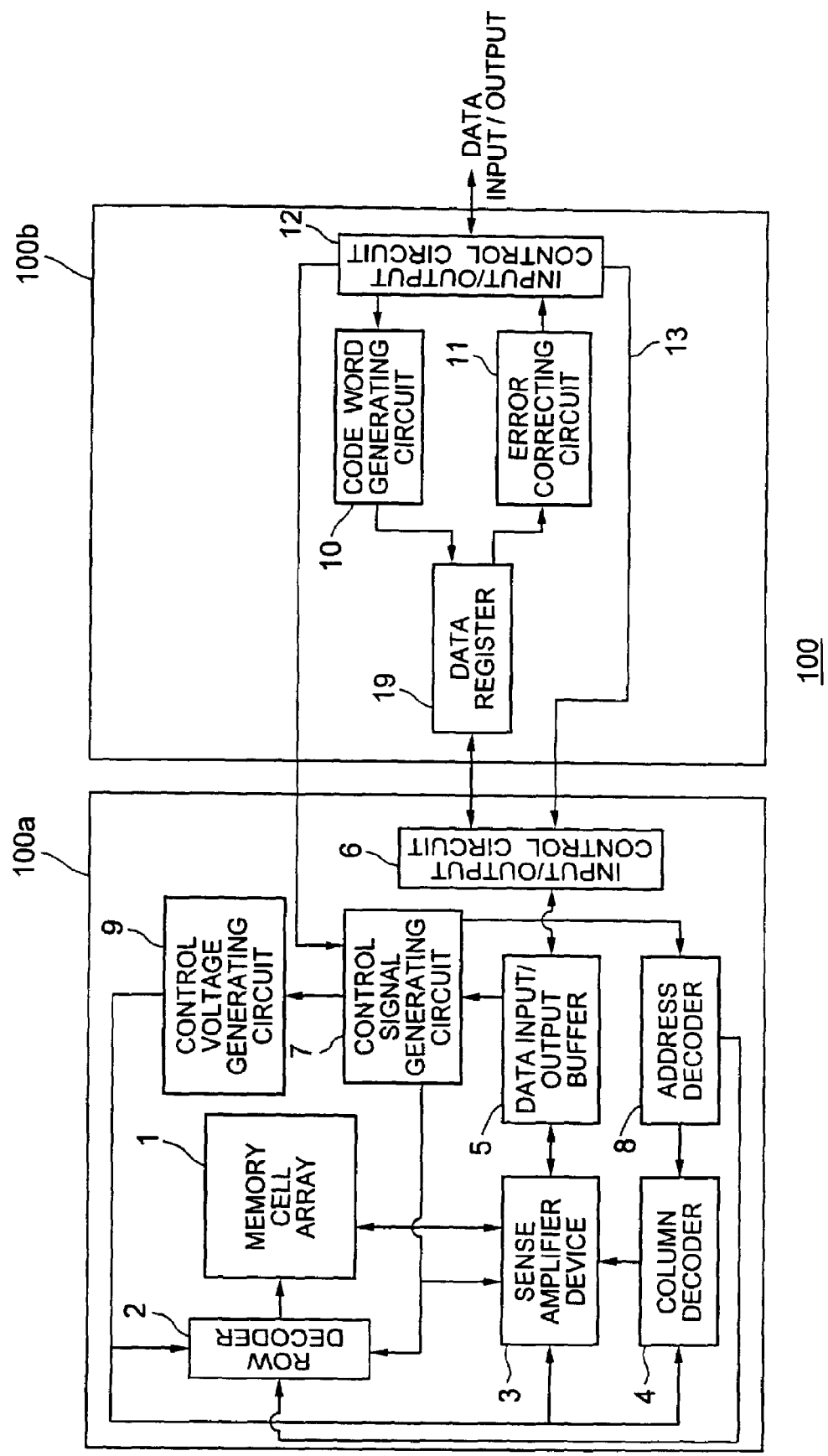
FIG. 1 is a block diagram showing a configuration of essential parts of a non-volatile semiconductor memory device 100 according to a first embodiment of the present invention.
Figure 2:
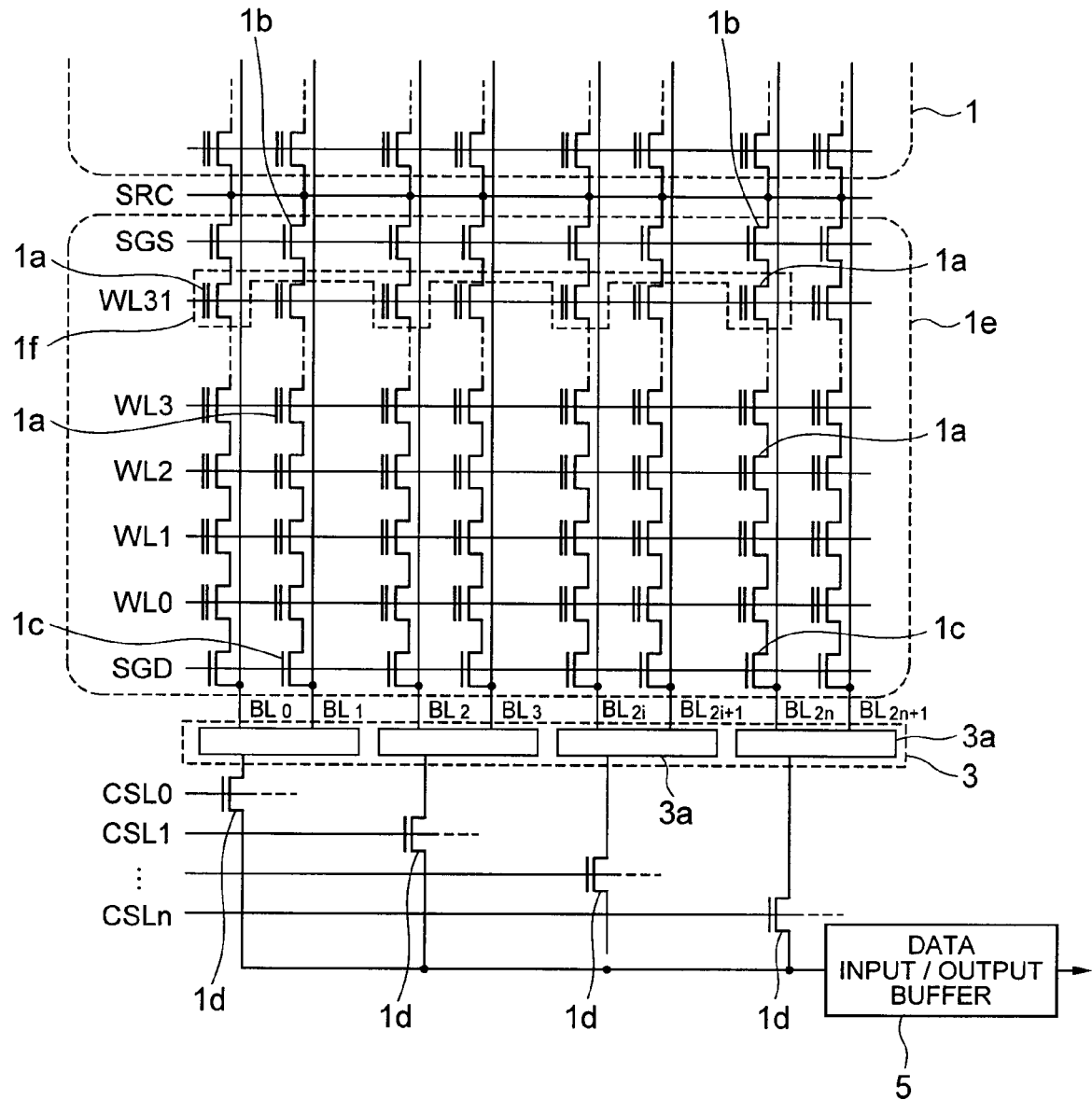
FIG. 2 is a circuit diagram showing a configuration of essential parts of a memory cell array 1 shown in FIG. 1.

FIG. 1 is a block diagram showing a configuration of essential parts of a non-volatile semiconductor memory device 100 according to a first embodiment of the present invention, which is an aspect of the present invention. FIG. 2 is a circuit diagram showing a configuration of essential parts of a memory cell array 1 shown in FIG. 1.

As shown in FIG. 1, the non-volatile semiconductor memory device 100 has a memory circuit 100a that includes at least a memory cell array 1, a row decoder 2, a sense amplifier device 3, a column decoder 4, a data input/output buffer 5, a first input/output control circuit 6, a control signal generating circuit 7, an address decoder 8, a control voltage generating circuit 9.

The non-volatile semiconductor memory device 100 further has a controller circuit 100b that includes at least a data register 19, a code word generating circuit 10, an error correcting circuit 11 and a second input/output control circuit 12.

The row decoder 2 is connected to word lines. The row decoder 2 includes a word line driving circuit (not shown) and makes a selection from the word lines of the memory cell array 1 and drives the word lines.

The sense amplifier device 3 is connected to bit lines of the memory cell array 1, reads data stored in memory cells and retains the read data and data written to the memory cells.

The column decoder 4 makes a selection from the bit lines of the memory cell array 1.

When reading data, data read by the sense amplifier device 3 is output to the first input/output control circuit 6 via the data input/output buffer 5.

The first input/output control circuit 6 supplies a command to the control signal generating circuit 7 via the data input/output buffer 5. The control signal generating circuit 7 decodes the command.

To the control signal generating circuit 7, external control signals including a chip enable signal "CE", a write enable signal "WE", a read enable signal "RE", an address latch enable signal "ALE" and a command latch enable signal "CLE" are supplied.

The control signal generating circuit 7 performs sequence control of data writing and data erasing and control of data reading based on the external control signal and the command supplied according to the operation mode.

According to the signals for controlling various operations, such as reading, writing and erasing, output from the control signal generating circuit 7, the control voltage generating circuit 9 generates voltages for the various operations.

The memory cell address is supplied to the control signal generating circuit 7 from the first input/output control circuit 6 via the data input/output buffer 5. The address is transferred to the row decoder 2 and the column decoder 4 via the address decoder 8.

Information data externally input via the second input/output control circuit 12 is loaded into the code word generating circuit 10. The code word generating circuit 10 generates redundant data based on the information data. Then, the code word generating circuit 10 creates a data correction unit composed of the information data and the redundant data, which is referred to as ECC frame. The ECC frame output from the code word generating circuit 10 is input to the first input/output control circuit 6 in the memory circuit 100a via the data register 19 and stored in a memory cell.

To the second input/output control circuit 12 in the controller circuit 100b, address data and command data are input in addition to the information data described above. The address data and the command data are used in the memory circuit 100a along with the external control signals described above. The data are directly input to the first input/output control circuit 6 in the memory circuit 100a via a bus 13, because a code word thereof does not need to be created.

On the other hand, data output from a memory cell in the memory circuit 100a is input to the error correcting circuit 11 when the ECC frame, which is an error correction unit, arrives at the data register 19. Then, the error correcting circuit 11 performs error correction of the information data based on the information data and the redundant data of the ECC frame. Then, the controller circuit 100b externally outputs the information data via the input/output control circuit 12 only when the error correcting circuit 11 has successfully corrected the information data.

As shown in FIG. 2, the memory cell array 1 is connected to word lines "WL1" to "WL31" extending in a row direction and to bit lines "BL0" to "BL2n+1" ("n" is an integer equal to or greater than 0) extending in a column direction and includes a plurality of memory cells (NAND cells) 1a arranged in a matrix.

The memory cell 1a can be set $2^x$ threshold voltages ("x" is an integer equal to or greater than 2). The memory cell 1a can store x-bit information corresponding to the $2^x$ threshold voltages. Each piece of x-bit information stored in a memory cell 1a can be read by applying a read voltage to an associated one of the word lines "WL1" to "WL31". That is, the memory cell 1a is a multilevel (multivalued) memory.

The memory cell array 1 further includes select gate transistors 1b that connect the memory cells 1a to a source line "SRC". Each select gate transistor 1b is connected to a source-side select gate line "SGS" at the gate thereof and controlled by a voltage applied to the source-side select gate line "SGS" by the row decoder 2.

The memory cell array 1 further includes select gate transistors 1c that connects the memory cells 1a to the bit lines "BL0" to "BL2n+1". Each select gate transistor 1c is connected to a drain-side select gate line "SGD" at the gate thereof and controlled by a voltage applied to the drain-side select gate line "SGD" by the row decoder 2.

A plurality of memory cells 1a are connected in series between the source-side select gate line "SGS" and the drain-side select gate line "SGD".

A voltage is applied to the gates of the memory cells 1a and the select gate transistors 1b and 1c in each memory cell array 1 through the word lines "WL0" to "WL31" connected to the row decoder 2, thereby controlling the write and read operations. Thus, the row decoder 2 applies a voltage to the word lines "WL0" to "WL31", thereby operating the memory cells.

The sense amplifier device 3 has n sense amplifier circuits 3a. Each sense amplifier circuit 3a is connected to the data input/output buffer 5 via a column select gate 1d. The column select gates 1d are controlled by column select signals "CSL0" to "CSLn". A pair of bit lines (the bit lines "BL0" and "BL1", for example) are connected to each sense amplifier circuit 3a.

The sense amplifier circuits 3a control columns of memory cell array 1. Specifically, the sense amplifier circuits 3a charge the bit lines "BL0" to "BL2n+1", thereby controlling the write and read operations.

A block 1e is composed of the plurality of memory cells 1a disposed between the source-side select gate line "SGS" and the drain-side select gate line "SGD". Data erasing is performed in units of blocks.

A sector 1f is composed of memory cells 1a that are connected to the same word line (the word line "WL31", for example) and simultaneously subjected to reading and writing. One sector 1f stores x pages of data (3 pages of data in a case of 3 bits, for example).

Now, there will be described bit allocation among threshold voltages of the memory cells of the non-volatile semiconductor memory device 100 that is configured as described above and essentially operates as described above.

As described above, the non-volatile semiconductor memory device 100 can store multiple-bit information in each memory cell 1a by utilizing variations in threshold voltage. In the read operation, a read voltage is applied to a single word line of a sector 1f in the same procedure. In addition, all the n sense amplifier circuits 3a input a signal to the bit lines in the same procedure. Then, the signal is processed by the sense amplifier circuits 3a, and a set of data for one page is collectively read in the column direction.

Now, there will be described an example in which data contained in the ECC frame described above is allocated as a data group to be stored in a memory cell group consisting of a plurality of memory cells selected by a word line.

Figure 3:
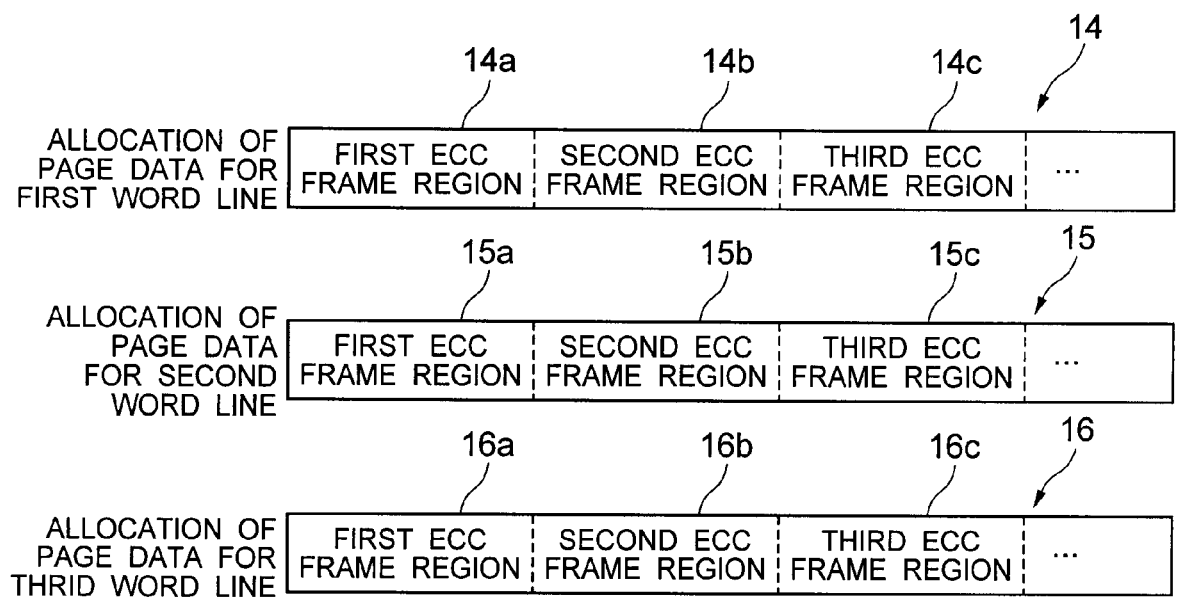
FIG. 3 is a diagram showing an example in which a plurality of ECC frames are allocated as data groups (corresponding to pages) stored in memory cell groups each consisting of a plurality of memory cells selected by a word line.

FIG. 3 is a diagram showing an example in which a plurality of ECC frames are allocated as data groups (corresponding to pages) stored in memory cell groups each consisting of a plurality of memory cells selected by a word line.

As shown in FIG. 3, a page 14 for a first word line is allocated among a first ECC frame region 14a for storing data contained in a first ECC frame, a second ECC frame region 14b for storing data contained in a second ECC frame, a third ECC frame region 14c for storing data contained in a third ECC frame and the like.

A page 15 for a second word line is allocated among a first ECC frame region 15a for storing data contained in a first ECC frame, a second ECC frame region 15b for storing data contained in a second ECC frame, a third ECC frame region 15c for storing data contained in a third ECC frame and the like.

A page 16 for a third word line is allocated among a first ECC frame region 16a for storing data contained in a first ECC frame, a second ECC frame region 16b for storing data contained in a second ECC frame, a third ECC frame region 16c for storing data contained in a third ECC frame and the like.

That is, data contained in the first ECC frame is allocated as a first data group to be stored in a first memory cell group consisting of a plurality of first memory cells selected by the first word line (corresponding to the page 14 for the first word line), a second data group to be stored in a second memory cell group consisting of a plurality of memory cells selected by the second word line (corresponding to the page 15 for the second word line), a third data group to be stored in a third memory cell group consisting of a plurality of memory cells selected by the third word line (corresponding to the page 16 for the third word line). Data contained in the second and third ECC frames are allocated in the same manner.

The first, second and third word lines are disposed in different areas in the memory cell array 1 (the first, second and third word lines may be disposed in the same block or different blocks). Therefore, for example, if the number of levels (the number of threshold voltages) is set for each word line, the error rate of the data stored in the memory cells can be different among the first to third word lines.

If each ECC frame is divided and allocated as a plurality of pages for allocation as described above, the data contained in the read ECC frames are uniform in error rate.

As a result, the location dependency of the error rate is made uniform among the ECC frames, and the efficiency of error correction is improved. Even if the number of levels (the number of threshold voltages) differs among the word lines, the location dependency of the error rate is made uniform among the ECC frames.

As described above, the non-volatile semiconductor memory device according to this embodiment improves the efficiency of error correction.

Second Embodiment

In the first embodiment, there has been described an arrangement for making the location dependency of the error rate uniform among the ECC frames.

In a second embodiment, in particular, there will be described an arrangement for making the location dependency of the error rate uniform by adapting allocation of data information of ECC frames in a case where the number of levels (the number of threshold voltages) differs among the word lines. A semiconductor memory device according to this embodiment is configured as shown in FIGS. 1 and 2 of First embodiment.

Figure 4:
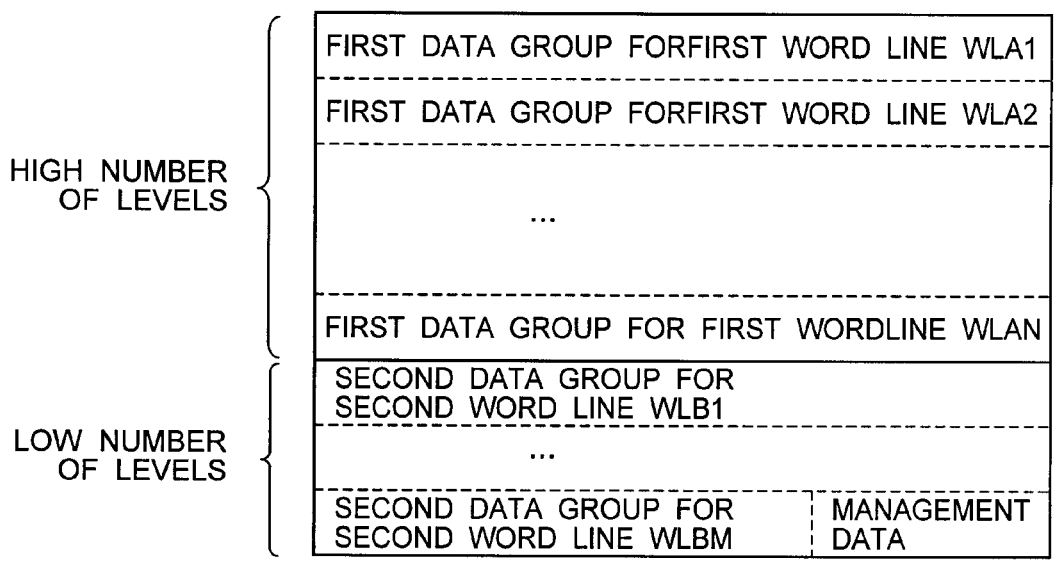
FIG. 4 is a conceptual diagram showing a set of data for a first word line for which the number of levels is high and a set of data for a second word line for which the number of levels is low.

FIG. 4 is a conceptual diagram showing a set of data for a first word line for which the number of levels is high and a set of data for a second word line for which the number of levels is low.

Referring to FIG. 4, a first data group (x-bit information) can be stored in a first memory cell group consisting of a plurality of first memory cells selected by first word lines "WLA1" to "WLAN".

Second memory cells are selected by second word lines "WLB1" to "WLBM" (M<N, for example). The number of threshold voltages of a plurality of the second memory cells is set lower than that of the first memory cells (that is, the number of multilevel of the second memory cells is set lower than that of the first memory cells).

This is intended to reduce the error rate of the data stored in the second memory cells by setting the number of levels (the number of threshold voltages) of the second memory cells lower than that of the first memory cells in a case where the error rate of the data stored in the second memory cells rises if the number of levels of the second memory cells is equal to that of the first memory cells, for example.

Thus, a second data group (y-bit information (y<x)) can be stored in a second memory cell group consisting of a plurality of second memory cells selected by the second word lines "WLB1" to "WLBM".

Management data is an arbitrary parameter set for each block. The management data includes at least one of information about the number of times of writing of the memory cells, information about the locations of the memory cells, and information about the time degradation of the memory cells, which are items of information for managing the memory cells.

Now, there will be described an example in which an ECC frame is allocated as data groups (pages or parts of pages) that differ in number of levels.

Figure 5:
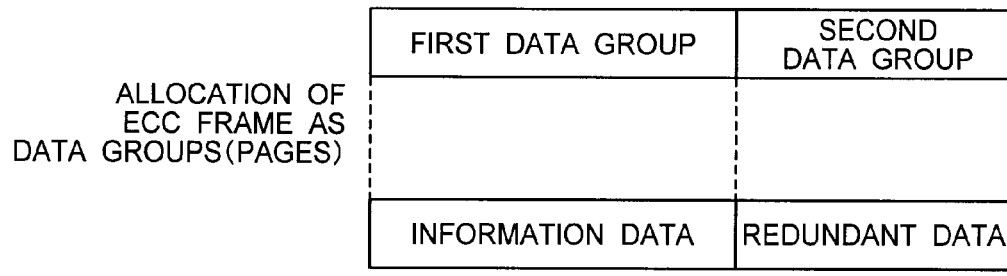
FIG. 5 is a diagram showing an example of allocation of an ECC frame as data groups that differ in number of levels.

FIG. 5 is a diagram showing an example of allocation of an ECC frame as data groups that differ in number of levels. In FIG. 5, a first data group contains data to be stored in a first memory cell group consisting of a plurality of first memory cells selected by one or more first word lines, and a second data group contains data to be stored in a second memory cell group consisting of a plurality of second memory cells selected by one or more second word lines.

As shown in FIG. 5, information data in the ECC frame is allocated as the first data group, and redundant data in the ECC frame is allocated as the second data group.

Thus, the redundant data for error correction can be stored in the memory cells that have a low number of levels and therefore have a low error rate.

Thus, the accuracy of error correction can be improved while making the location dependency of the error rate uniform and improving the efficiency of error correction.

Figure 6:
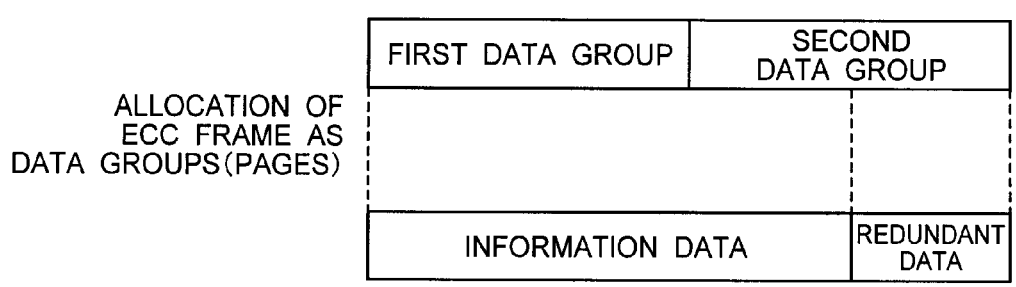
FIG. 6 is a diagram showing another example of allocation of an ECC frame as data groups that differ in number of levels.

FIG. 6 is a diagram showing another example of allocation of an ECC frame as data groups that differ in number of levels. In FIG. 6, similarly, a first data group contains data to be stored in a first memory cell group consisting of a plurality of first memory cells selected by one or more first word lines, and a second data group contains data to be stored in a second memory cell group consisting of a plurality of second memory cells selected by one or more second word lines.

As shown in FIG. 6, part of the information data of the ECC frame is allocated as the first data group, and the remaining part of the information data of the ECC frame and the redundant data of the ECC frame are allocated as the second data group.

Thus, as in the case shown in FIG. 5, the redundant data for error correction can be stored in the memory cells that have a low number of levels and have a low error rate.

Thus, the accuracy of error correction can be improved while making the location dependency of the error rate uniform and improving the efficiency of error correction.

Figure 7:
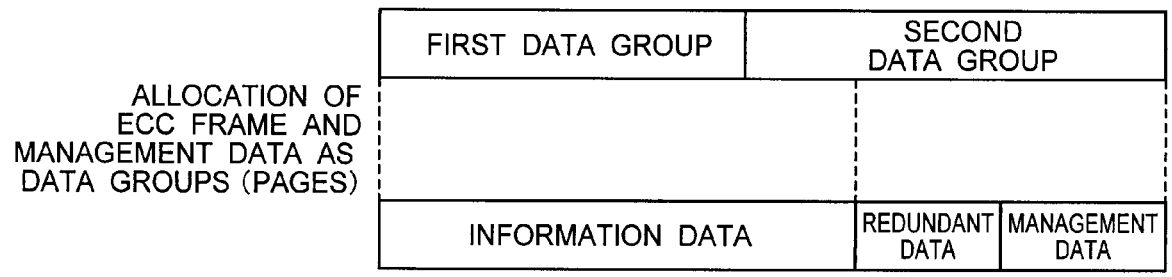
FIG. 7 is a diagram showing another example of allocation of an ECC frame as data groups that differ in number of levels.

FIG. 7 is a diagram showing another example of allocation of an ECC frame as data groups that differ in number of levels. In FIG. 7, similarly, a first data group contains data to be stored in a first memory cell group consisting of a plurality of first memory cells selected by one or more first word lines, and a second data group contains data to be stored in a second memory cell group consisting of a plurality of second memory cells selected by one or more second word lines.

As shown in FIG. 7, the information data of the ECC frame is allocated as the first data group, and the redundant data and the management data of the ECC frame are allocated as the second data group.

In general, writing of the management data requires high reliability. Therefore, as shown in FIG. 7, the management data is stored in the memory cells that have a low number of levels and have a low error rate.

Thus, as in the case shown in FIG. 5, the redundant data for error correction can be stored in the memory cells that have a low number of levels and have a low error rate. Furthermore, the reliability of the management data stored in the memory cells is improved.

Thus, the accuracy of error correction can be improved while making the location dependency of the error rate uniform and improving the efficiency of error correction.

As described above, the non-volatile semiconductor memory device according to this embodiment improves the efficiency of error correction.

What is claimed is:

1. A non-volatile semiconductor memory device, comprising:
a memory cell array including a plurality of memory cells that are connected to word lines extending in a row direction and bit lines extending in a column direction, store x-bit information corresponding to $2^x$ threshold voltages (x is an integer equal to or greater than 2), the stored x-bit information being capable of being read by applying a read voltage to said word lines;
a row decoder that is connected to said word lines and supplies a voltage to said word lines to make said memory cells operate;
a sense amplifier device that is connected to said bit lines, reads data stored in said memory cells and retains the read data and data written to said memory cells;
a code word generating circuit that creates an ECC frame composed of input information data and redundant data to be stored in said memory cells based on said information data; and
an error correcting circuit that corrects said information data based on said information data and said redundant data of said ECC frame,
wherein data contained in said ECC frame is allocated as a first data group to be stored in a first memory cell group composed of a plurality of first memory cells selected by a first word line and a second data group to be stored in a second memory cell group composed of a plurality of second memory cells selected by a second word line.

2. The non-volatile semiconductor memory device according to claim 1, wherein the number of threshold voltages of said second memory cells is set lower than that of said first memory cells.

3. The non-volatile semiconductor memory device according to claim 2, wherein said information data of said ECC frame is allocated as said first data group, and said redundant data of said ECC frame is allocated as said second data group.

4. The non-volatile semiconductor memory device according to claim 2, wherein part of said information data of said ECC frame is allocated as said first data group, and the remaining part of said information data of said ECC frame and said redundant data of said ECC frame are allocated as said second data group.

5. The non-volatile semiconductor memory device according to claim 2, wherein said information data of said ECC frame is allocated as said first data group, and said redundant data of said ECC frame and management data for management of said memory cells are allocated as said second data group, said management data including at least one of information about the number of times of writing of said memory cells, information about the locations of said memory cells, and information about the time degradation of said memory cells.

6. The non-volatile semiconductor memory device according to claim 1, wherein the non-volatile semiconductor memory device is an NAND flash memory.

7. The non-volatile semiconductor memory device according to claim 2, wherein the non-volatile semiconductor memory device is an NAND flash memory.

8. The non-volatile semiconductor memory device according to claim 3, wherein the non-volatile semiconductor memory device is an NAND flash memory.

9. The non-volatile semiconductor memory device according to claim 4, wherein the non-volatile semiconductor memory device is an NAND flash memory.

10. The non-volatile semiconductor memory device according to claim 5, wherein the non-volatile semiconductor memory device is an NAND flash memory.

* * * * *